United States Patent [19]

Brodie et al.

[11] 4,360,880
[45] Nov. 23, 1982

[54] RECIRCULATING RMS AC CONVERSION METHOD AND APPARATUS WITH FAST MODE

[75] Inventors: Benjamin T. Brodie; Henriecus Koeman, both of Edmonds, Wash.

[73] Assignee: John Fluke Mfg. Co., Inc., Mountlake Terrace, Wash.

[21] Appl. No.: 228,081

[22] Filed: Jan. 26, 1981

Related U.S. Application Data

[63] Continuation-in-part of Ser. No. 62,923, Aug. 2, 1979, Pat. No. 4,274,143.

[51] Int. Cl.³ .......................................... G01R 15/10
[52] U.S. Cl. .................................. 364/483; 324/132; 328/144
[58] Field of Search ...................... 364/813, 814, 483; 324/123 R, 106, 132; 328/144, 145, ; 307/230, 261, 151

[56] References Cited

U.S. PATENT DOCUMENTS

| | | | |
|---|---|---|---|
| 2,518,525 | 6/1970 | Duckworth et al. | 321/1.5 |
| 3,303,423 | 2/1967 | Staschover et al. | 324/106 |
| 3,384,805 | 5/1968 | Exworthy | 321/9 |
| 3,423,578 | 1/1969 | Platzer, Jr. et al. | 364/483 |
| 3,434,053 | 3/1969 | McKee | 324/132 |
| 3,488,482 | 1/1970 | Ley | 364/483 |
| 3,591,785 | 7/1971 | Miller | 364/602 |
| 3,624,525 | 11/1971 | Smith | 328/144 |
| 3,723,845 | 3/1973 | Duckworth | 321/1.5 |
| 3,795,868 | 3/1974 | Ohme et al. | 328/144 |
| 3,840,813 | 10/1974 | Allen et al. | 364/814 X |
| 3,845,388 | 10/1974 | Ley et al. | 324/106 |
| 3,911,359 | 10/1975 | Metcalf | 328/144 X |
| 3,911,359 | 10/1975 | Metcalf | 324/106 |
| 4,050,025 | 9/1977 | Gerber | 364/483 X |
| 4,109,165 | 8/1978 | Katakura et al. | 364/814 X |
| 4,145,661 | 3/1979 | Wong | 324/132 X |
| 4,199,817 | 4/1980 | Conkling et al. | 364/602 X |
| 4,274,143 | 6/1981 | Brodie et al. | 364/483 |

Primary Examiner—Edward J. Wise
Attorney, Agent, or Firm—Christensen, O'Connor, Johnson & Kindness

[57] ABSTRACT

A signal whose RMS value is to be accurately determined is first converted into DC form by a relatively inaccurate RMS converter, such as a thermal RMS converter (15). The result is a first converter signal ($Y_1$), which is stored for recirculation in a suitable storage device, such as a sample and hold circuit (17). Thereafter, the signal stored in the storage device is recirculated to the converter to create a second converter signal ($Y_2$). Then, the second converter signal is subtracted from the doubled value of the first converter signal ($2Y_1-Y_2$) to produce a corrected RMS signal (X). The difference between the first converter signal ($Y_1$) and the corrected RMS signal (X) is then determined. This error signal (E) is stored. Next, a decision is made as to whether or not a fast mode of operation is to be followed. If it is not to be followed the corrected RMS signal is displayed. If the fast mode is to be followed, the signal whose RMS value is to be accurately determined is reapplied to the RMS converter. The result is a third converter signal from which the error signal is subtracted to produce a corrected signal that accurately represents the RMS value of the reapplied signal. This corrected signal is then displayed or applied to other downstream subsystems, such as signal analyzers or recorders. The fast mode steps are then repeated.

15 Claims, 3 Drawing Figures

RECIRCULATING RMS AC CONVERSION METHOD AND APPARATUS WITH FAST MODE

CROSS-REFERENCE TO RELATED APPLICATION

This application is a continuation-in-part of U.S. Pat. application Ser. No. 062,923, filed Aug. 2, 1979, and entitled "Recirculating RMS AC Conversion Method and Apparatus," now U.S. Pat. No. 4,274,143. The contents of U.S. Pat. No. 4,274,143 incorporated herein by reference.

TECHNICAL AREA

This invention is directed to electronic conversion and, more particularly, to electronic conversion methods and apparatus for determining the root means square (RMS) value of an unknown signal.

BACKGROUND OF THE INVENTION

The ability to determine the RMS value of an unknown, e.g., AC signal with a high degree of accuracy is of critical importance in many environments. Presently, AC voltmeters provide accuracy to about 0.1% (1000 part per million). When higher accuracy is required, transfer standards are used. Transfer standards are used to measure the RMS value of an unknown AC signal by determining the difference between the RMS value of the unknown AC signal and a preset, accurately measured DC equivalent. While the use of transfer standards provides accuracy in the 100 parts per million (ppm) range, it has a number of disadvantages. First, the cost of the transfer standards test equipment required to achieve this accuracy is higher than desired. Secondly, and more importantly, the time required to make a transfer standards measurement having an accuracy in the 100 ppm range normally requires several (e.g., 5) minutes. As a result, the use of a transfer standards approach to determining the RMS value of a signal is both costly and time consuming. Thus, a need exists for an inexpensive measuring system for producing a signal that accurately represents the RMS value of an unknown AC signal.

While AC voltmeters and transfer standards have been utilized in the past to accurately determine the RMS value of an unknown signal, other, less accurate and substantially less expensive, devices have been developed for converting an unknown AC signal into a DC signal having a magnitude that is equal to the RMS value of the AC signal. One form of such systems applies the AC signal to be converted to a first heating element such as a thermal resistor. The heat produced is thermally coupled to a suitable heat sensor, such as a transistor, which is connected in a differential circuit with a similar heat sensor. The differential output is utilized to control the DC power applied to a second heating element thermally coupled to the second heat sensor. At balance, the DC feedback voltage applied to the second heating element is equal to the RMS value of the unknown AC signal applied to the first heating element. Devices of this type having a conversion accuracy of 0.5% have been produced. Such a device is disclosed in U.S. patent application Ser. No. 842,972, filed Oct. 17, 1977, by Roy W. Chapel, Jr. and I. Macit Gurol and entitled "Thermally Isolated Monolithic Semiconductor Die," now U.S. Pat. No. 4,257,061. While an accuracy of 0.5% (5000 ppm) is inadequate in many environments, these RMS converters have the advantage that they can be relatively inexpensively produced.

U.S. Pat. No. 4,274,143, entitled "Recirculating RMS AC Conversion Method and Apparatus" describes a method and apparatus for providing highly accurate RMS conversion using a low cost thermal RMS converter. In this method and apparatus the signal whose RMS value is to be accurately determined is first converted into DC form by a relatively inaccurate thermal RMS converter. The result is a first converter signal ($Y_1$), which is stored for recirculation in a suitable storage device, such as a sample and hold circuit. The first converter signal is also doubled ($2Y_1$) and stored. Thereafter, the first converter signal stored in the storage device is recirculated to the converter to create a second converter signal ($Y_2$). Then, the second converter signal is subtracted from the doubled first converter signal ($2Y_1 - Y_2$) to produce a highly accurate RMS output signal.

While the method and apparatus described in U.S. Pat. No. 4,274,143 is a substantial step forward in the art of accurately determining the RMS value of an unknown signal, it has one disadvantage. Specifically, the time required to accurately determine the RMS value of an unknown signal is greater than desired, particularly when a continuous determination is needed or desired. In this regard, in one actual embodiment of the invention described in U.S. Pat. No. 4,274,143 the time required to provide an accurate determination of the RMS value of an unknown signal is approximately six (6) seconds. While this time period is substantially less than the time required to make an accurate measurement using the prior art transfer standards technique [approximately five (5) minutes], this time period [e.g., six (6) seconds] is still longer than desirable when a continuous, accurate RMS conversion is required.

Therefore, it is an object of this invention to provide a new and improved high speed, highly accurate RMS conversion method and apparatus.

It is another object of this invention to provide a high speed, highly accurate RMS converter.

It is a further object of this invention to provide a highly accurate RMS conversion method and apparatus that rapidly and continuously converts an AC input signal into a DC signal having a magnitude proportioned to the RMS value of the AC signal.

It is yet another object of this invention to provide a highly accurate, high speed RMS converter system that uses a relatively inexpensive thermal RMS converter.

SUMMARY OF THE INVENTION

In accordance with this invention a recirculating RMS AC conversion method and apparatus with fast mode is provided. The signal whose RMS value is to be accurately determined is first converted into DC form by a relatively inaccurate RMS converter, such as a thermal RMS converter. The result is a first converter signal ($Y_1$), which is stored. Next, the stored first converter signal is recirculated to the converter to create a second converter signal ($Y_2$). The stored first converter signal is doubled and, then, the second converter signal is subtracted from the doubled first converter signal ($2Y_1 - Y_2$) to produce a connected RMS signal (X). Next, the difference between the stored A/D output ($Y_1$) and the result of the subtraction (X) is determined. This error signal (E) is stored. Then a test is made to determine if the fast mode of operation is to be followed. If it is not to be followed the result of the subtraction is displayed, as described in U.S. patent application Ser. No. 062,923, to provide a highly accurate RMS output. Contrariwise, if the fast mode of operation is to be followed, the signal whose RMS value is to be accurately determined is again converted to DC form by the converter and the stored error subtracted from the result. The result of the subtraction is displayed whereby a highly accurate RMS output is again provided. The fast mode steps of converting the signal whose RMS value is to be determined and subtracting the stored error from the result are then repeated.

In one specific embodiment of the invention, the unknown (AC) signal is applied via a first switch to the input of a thermal RMS converter. The output of the thermal RMS converter is connected to an analog-to-digital converter and to the input of a sample and hold circuit. The output of the sample and hold circuit is connected to the input of the thermal RMS converter through a second switch. When the first switch is closed, the thermal RMS converter converts the unknown AC signal into a DC signal having a magnitude equal to the RMS value of the AC signal, plus some error. At this time the second switch is open and the sample and hold circuit is in its sample mode of operation. As a result, the sample and hold circuit stores the relatively inaccurate RMS value of the unknown signal produced by the thermal converter. After a sufficient time has elapsed for the thermal converter to stabilize, the output of the converter is converted from analog form to digital form by the analog-to-digital converter and the result is stored. Thereafter, the first switch is opened and the second switch is closed. At the same time, the sample and hold circuit is switched from its sample mode of operation to its hold mode of operation. After a predetermined period of time, adequate for the thermal converter to stabilize and switch transients to terminate, the output of the thermal converter is converted from analog form to digital form and the result subtracted from a doubled value of the stored digital signal. Then the difference between the stored digital signal and the result of the subtraction is determined and stored as an error signal. Next, a determination of whether or not the embodiment of the invention is in a fast mode of operation is made. If it is not in a fast mode of operation, the result of the subtraction is applied as a highly accurate digital RMS signal that can be used to control a suitable digital display, recorded on a suitable recording medium or applied to a suitable analyzing system. Contrariwise, if the embodiment is in the fast mode of operation, the first switch is again closed and the second switch is opened. After a sufficient time has elapsed for the thermal converter to again stabilize, the output of the thermal converter is converted from analog form to digital form and the stored error signal subtracted from the result. The result of the subtraction is supplied as a highly accurate digital RMS signal that can be used to control the digital display, recorded on the recording medium or applied to the analyzing system. The sequence of subtracting the stored error signal from the digitized output of the thermal converter is repeated as long as the embodiment is in the fast mode of operation.

It will be appreciated that the invention is ideally suited for use in an instrument for measuring the RMS value of unknown signals. When the invention is included in such an instrument, preferably, the open/closed states of the first and second switches and the sample/hold state of the sample and hold circuit are controlled by a controller that also performs or controls the storage, doubling, subtraction and display functions.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying wherein.

DESCRIPTION OF THE PREFERRED EMBODIMENTS

Figure 1:
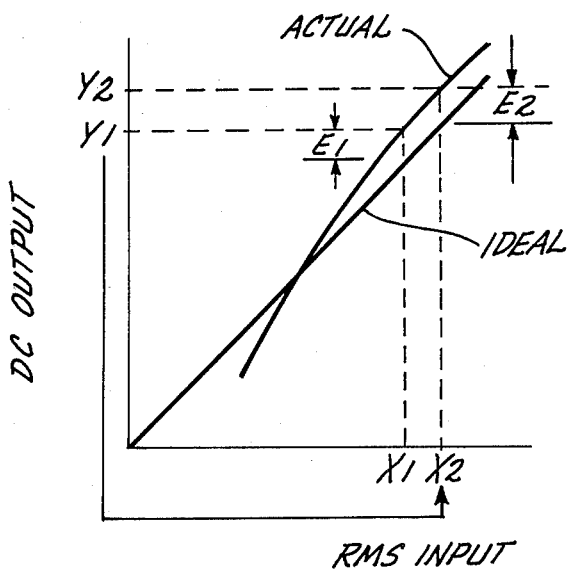
FIG. 1 is graph utilized to assist in the description of the development of the error signal.

As will be better understood from the following description of the preferred embodiments of the invention, the present invention is based on sequentially applying first the unknown (AC) signal to a relatively inaccurate RMS converter; and, then, the output of the RMS converter obtained as a result of the application of the unknown AC signal to the RMS converter. A corrected RMS value is determined by doubling the first converter signal and subtracting from the doubled signal the second converter signal. Then the error between the output of the RMS converter when the unknown signal is applied and the corrected RMS value is determined. This error is then used to correct subsequent converter outputs when unknown signals of similar magnitudes are converted. FIG. 1 illustrates, and the following discussion describes, why this technique produces a highly accurate RMS output signal.

FIG. 1 is a graph illustrating the transfer curves of an ideal RMS converter and an actual (thermal) RMS converter. The abscissa or horizontal axis of the graph denotes the true RMS value of the input signal and the ordinate or vertical axis denotes the actual DC output. The ideal curve is, of course, a 45° line that bisects the coordinate system, because the DC output of an ideal converter is exactly equal to the RMS value of the input signal. The problem is that realizable RMS converters, such as thermal RMS converters, do not follow the ideal curve. Rather, they follow a curve that is close, but not identical, to the ideal curve. An example of a thermal RMS converter curve, for a converter of the type described in U.S. patent application Ser. No. 842,972 referenced above, is illustrated in FIG. 1 and denoted "actual." As can be seen from FIG. 1, the actual curve shows that a signal having a true RMS value of $X_1$ produces an actual DC output of $Y_1$. The difference is an error $E_1$. That is, $X_1 = Y_1 - E_1$. Similarly, a second signal, having a true RMS value of $X_2$ produces an output signal $Y_2$. The difference is an error $E_2$. More specifically, $X_2 = Y_2 - E_2$. Alternatively, the foregoing equations can be represented as $Y_1 = X_1 + E_1$ and $Y_2 = X_2 + E_2$, respectively.

As discussed above, the invention is based on recirculating to the RMS converter an output signal obtained as a result of the conversion of an unknown signal. As a result, if $X_1$ is defined to equal the true RMS value of the unknown signal, $X_2$ can be set equal to $Y_1$. As also discussed above, in accordance with the invention, $Y_1$ is doubled and the value of $Y_2$ is subtracted from the doubled value of $Y_1$ to obtain a corrected RMS value. Thus, the corrected RMS value determined in accordance with the invention is computed based on the equation $X = 2Y_1 - Y_2$, where X is the corrected RMS value. Substituting the foregoing values for $Y_1$ and $Y_2$ results in the equation $X = 2(X_1 + E_1) - (X_2 + E_2)$. Since $X_2 = Y_1$, by definition, the value of $Y_1$ can be substituted for $X_2$ whereby this equation becomes $X = 2(X_1 + E_1) - (X_1 + E_1 + E_2)$. Cancellation of terms results in the equation $X = X_1 + E_1 - E_2$. Since the $Y_1$ and $Y_2$ voltages are relatively close to each other, $E_1$ and $E_2$ are very close to one another whereby X is substantially equal to $X_1$, which was originally defined as the actual RMS value of the input signal. It can be shown that the error is equal to twice the worst case error of the sensor squared. Thus, if the thermal sensor has a worst case accuracy of 0.5% (5000 ppm), the system accuracy is 50 ppm $[2(0.005)^2 = 0.000050]$.

While the sequence of steps described in the preceding paragraph provides an extremely accurate RMS value, it has one disadvantage when implemented in an actual structure, particularly when accurate RMS values are to be continuously determined. Specifically, in one actual structure it was found that the sequence of steps required six (6) seconds to complete. While this time is significantly less than the time required by the common prior art technique using transfer standards (approximately five minutes), it is still longer than desirable. Thus, the invention also provides a fast mode sequence that decreases the time required to develop an accurate RMS value. The fast mode sequence comprises determining the error between the corrected RMS value (X) and the RMS value obtained when the unknown signal was applied ($Y_1$); and, storing the error ($E = Y_1 - X$) for later use in correcting the output of the converter when the unknown signal is again converted. As will be readily appreciated from viewing FIG. 1 this correction procedure results in a less and less accurate RMS value the greater the RMS difference between the unknown signal used to develop the error value and the unknown signal corrected using the error value. As a result, preferably, the fast mode sequence is only used when these signals are within one percent (1%) of each other. Further, the error must not change appreciably after it is determined. In a practical system using a thermal RMS converter of the type described in U.S. patent application Ser. No. 842,972, the converter temperature must remain reasonably stable ($\pm 1°$ C.) and the elapsed time since the error was determined must be less than one (1) hour in order for the invention to produce acceptably accurate results. Other converters may have more or less stringent requirements.

Figure 2:
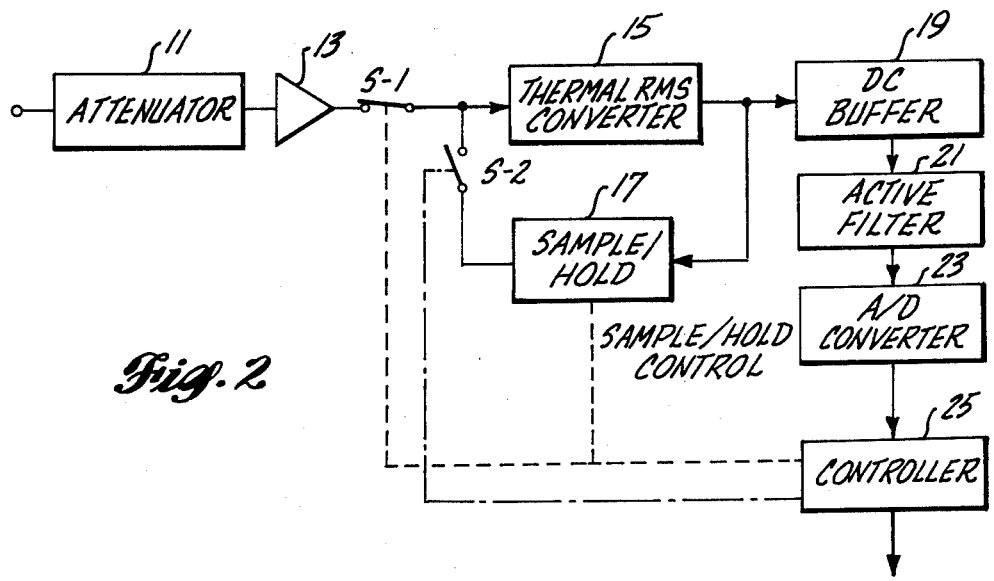
FIG. 2 is a block diagram of a preferred embodiment of the invention.

FIG. 2 illustrates a preferred embodiment of the invention and includes: an attenuator 11; a buffer amplifier 13; a thermal RMS converter 15; a sample and hold circuit 17; a DC buffer amplifier 19; an active filter 21; an analog-to-digital (A/D) converter 23; and, a controller 25. Also, illustrated in FIG. 2 are first and second single pole switches designated S-1 and S-2. While S-1 and S-2 are illustrated as simple switches, as will be appreciated by those skilled in the electronics art, in an actual embodiment of the invention, these switches would be formed by semiconductor switches, such as field effect transistor switches, for example.

The unknown AC signal is applied via the attenuator 11 to the input of the buffer amplifier 13. The output of the buffer amplifier 13 is applied through S-1 to the input of the thermal RMS converter 15. The output of the thermal RMS converter 15 is applied to the input of the sample and hold circuit 17; and, the output of the sample and hold circuit 17 is applied through S-2 to the input of the thermal RMS converter 15. The output of the thermal RMS converter 15 is also applied through the DC buffer amplifier 19 and the active filer 21, connected in series, to the input of the A/D converter 23. The output of the A/D converter 23 is applied to the input of the controller 25. As illustrated by the dashed lines, the controller controls the opening and closing of S-1 and S-2; and, the mode of operation of the sample and hold circuit 17. S-1 and S-2 are always in alternate opened and closed states. That is, when S-1 is closed S-2 is opened and vise versa. In addition, when S-1 is closed (and S-2 is open) the sample and hold circuit 17 is placed in a sample mode of operation. Contrariwise, when S-1 is open (and S-2 is closed) the sample and hold circuit is placed in a hold mode of operation.

While various types of thermal RMS converters can be used in actual embodiments of the invention, the thermal RMS converter preferred is one of the types described in U.S. Pat. No. 4,257,061, filed Oct. 17, 1977, by Roy W. Chapel, Jr. and I. Macit Gurol and entitled "Thermally Isolated Monolithic Semiconductor Die," and assigned to the assignee of the present invention. As necessary to an understanding of the present invention, the information contained in the U.S. Pat. No. 4,257,061 is incorporated herein by reference. While the thermal RMS converter described in U.S. Pat. No. 4,257,061, is preferred, it will be appreciated that other thermal RMS converters can be used, as long as they have a relatively smooth transfer characteristic curve of the type generally illustrated by the actual curve in FIG. 1. Also, RMS converters other than thermal RMS converters can be utilized if they have a suitably smooth transfer characteristic curve. Further, while the device for temporarily storing the output of the thermal RMS is illustrated as a sample and hold circuit, obviously, other types of storage devices can be utilized if desired. In this regard, as will be understood from the following description of the operation of the embodiment of the invention, illustrated in FIG. 2, the controller receives the same data that is stored by the sample and hold circuit 17, except in digital form. The digital information stored by the controller could be converted from digital form to analog form and utilized to provide the same DC signal as that applied by the sample and hold circuit to the input of the thermal RMS converter when S-2 is closed.

Turning now to a description of the operation of the embodiment of the invention illustrated in FIG. 2; initially, S-1 is closed and S-2 is open; and, the sample and hold circuit is placed in a sample mode of operation. At this time, the unknown signal received by the attenuator 11 is applied through the buffer amplifier 13 to the input of the thermal RMS converter 15. The thermal RMS converter, in a conventional manner, produces a DC output signal whose magnitude is equal (or directly proportional) to the RMS value of the unknown signal, within a certain percent accuracy. This DC signal is stored by the sample and hold circuit 17. In addition, the DC output of the thermal RMS converter is buffered by the DC buffer 19, filtered by the active filter 21 and converted from analog form to digital form by the A/D converter 23. The resultant digital signal is applied to the controller 25. After a predetermined period of time, adequate for the output of the thermal RMS converter 15 to become stabilized (this usually occurs within 3 seconds or so), the controller reads the output of the A/D converter. Thereafter, the controller opens S-1 and closes S-2. At the same time, the sample and hold circuit is switched from a sample mode of operation to a hold mode of operation. Thereafter, the thermal RMS converter 15 converts the output of the sample and hold circuit. The new DC output of the thermal RMS converter is also buffered by the DC buffer 19 and filtered by the active filter 21. The output of the active filter is converted by the A/D converter 23 from analog form to digital form and the result (after the stabilization period) is read by the controller 25. Thereafter, the controller functions in accordance with the foregoing equation ($X=2Y_1-Y_2$) to produce a corrected RMS output signal suitable for application to a display, recording edium or suitable signal analyzer; and, suitable for determining an error signal for later use in the manner next described.

In accordance with the invention after the corrected RMS value (X) is determined, it is used to determine the error in the thermal converter output when the unknown signal was applied ($Y_1$). That is, the error (E) is equal to $Y_1-X$. After the value of the error, E, is determined, it is used to correct the output of the thermal converter when the unknown signal is again applied to the input of the thermal converter.

Figure 3:
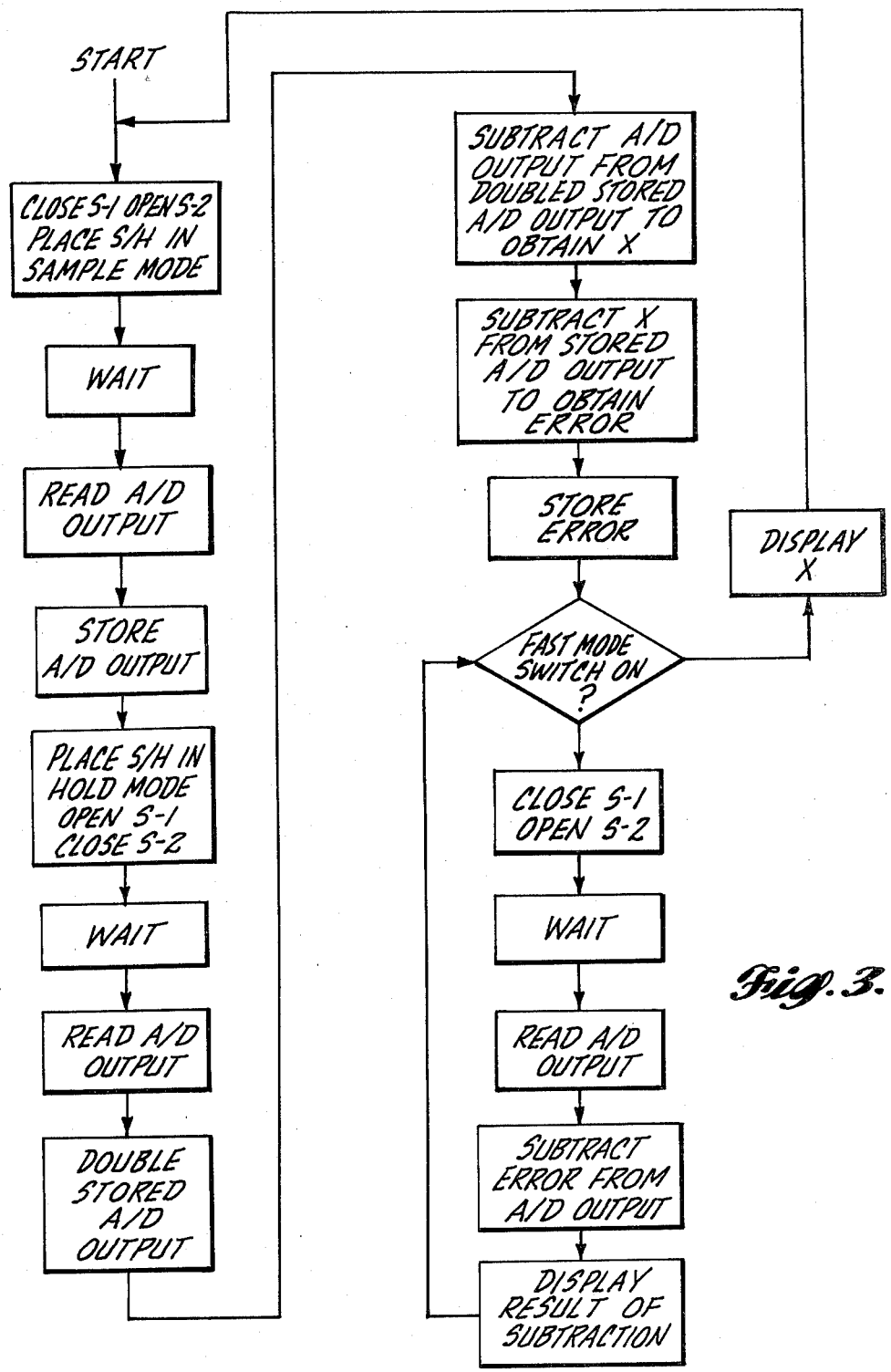
FIG. 3 is a flow diagram illustrating the operation of the controller illustrated in FIG. 2.

Preferably the controller is in the form of a microprocessor programmed to function in accordance with the invention. FIG. 3 is a flow diagram illustrating the programming of a microprocessor adapted to function in accordance with the invention.

As shown in FIG. 3, at start, the microprocessor closes S-1, opens S-2 and places the sample and hold (S/H) circuit in a sample mode of operation. Thereafter, the microprocessor idles or waits for a predetermined period of time to allow the output of the thermal RMS converter to settle. After the lapse of this period of time, the output of the A/D converter is read and stored. Next, the sample and hold circuit is placed in a hold mode of operation, S-1 is opened and S-2 is closed. Thereafter, the microprocessor idles or waits for a predetermined period of time to allow the output of the thermal RMS converter to again settle (and switch transients to terminate). After the period of time has elapsed, the output of the A/D converter is again read. Then the previously stored output of the A/D converter is doubled and the new output of the A/D converter is subtracted from the doubled A/D converter output. The result is an accurate, corrected RMS output signal formed in accordance with the equation $X=2Y_1-Y_2$. Next, the error between the result of the subtraction, i.e., the corrected RMS value (X) and the stored output of the A/D converter is determined by subtracting X from the stored A/D output and, then, this error value is stored. The next step is a test to determine if the fast mode of operation sequence is or is not to be followed. This test is accomplished by reading the state of a two-position switch. When this switch is in one position the fast mode of operation sequence is not followed and when this switch is in the other position it is followed.

When the fast mode is not to be followed the fast mode switch is not on (i.e., it is open). In this case, the result of the subtraction (X) is the output of the microprocessor that is sent to the display (or other downstream receiver). Then, the program cycles back to the start point.

When the fast mode of operation sequence is to be followed the fast mode switch is on (i.e., it is closed). In this case, the microprocessor again closes S-1 and opens S-2. At the same time the sample and hold circuit is switched to its hold mode of operation, or entirely disconnected by a further S/H input switch (not shown). In any event, the thermal RMS converter 15 again converts the input unknown signal. Thereafter, the microprocessor again waits for a predetermined period of time. After the period of time has elapsed, the output of the A/D converter is read. Then, the stored error is subtracted from the A/D output. The result is the output of the microprocessor that is sent to the display (or other downstream receiver). Thereafter, the program cycles back to the point where a test is made to determine the status of the fast mode switch. If the fast mode switch is still on, the fast mode sequence of operation steps are repeated. When the fast mode steps are repeated, the wait period can be relatively short since the switch state is not changed (whereby switch transients are not created) and the converter output changes very little (whereby substantially no thermal settling time is required).

As will be readily appreciated from the foregoing description the fast mode of operation substantially cuts the time required to obtain an accurate RMS output. More specifically, the major portion of the time consumed during the operation of the program illustrated in FIG. 3 are consumed by the wait steps. In one actual embodiment of the invention the two wait steps in the error determining portion of the program each consume approximately three (3) seconds. The first three (3) second wait is primarily the result of the settling time requirement of the thermal RMS converter and the second three (3) second wait is primarily the result of switch transient settling time requirements. Thus, the time required to develop one accurate RMS value from the start point to the point where the state of the fast mode switch is tested require approximately six (6) seconds. Contrariwise, the fast mode sequence may consume one-half ($\frac{1}{2}$) second, once the error value is determined. The reason that the wait step in the fast mode can be much smaller results from the fact that only small changes in the input (e.g., 1%) are allowable whereby converter settling time is low, and the fact that no switching is required, whereby no switch transient settling time is required. Thus, while the fast mode sequence is slightly less accurate than the non-fast mode sequence, the result is produced in substantially less time. Consequently, the fast mode sequence is often more useful when a continuous output (requiring continuous conversions) are required or desired. There is, however, one disadvantage to the fast mode sequence. Specifically, it becomes less and less accurate as the difference between the value of the unknown signal when the error is determined and the value of unknown signal when the error is used to correct it becomes greater and greater. This result occurs because the error signal varies over the range of unknown signals. As a result, preferably, the fast mode sequence is only used when the later unknown signals produce an RMS value that is within a predetermined percent [e.g., one percent (1%)] of the RMS value of the unknown signal when the error value is determined. This determination can be made mentally by the operator of an actual embodiment of the invention or automatically by the microprocessor comparing the two values and providing an indicator energizing control signal when the percent difference exceeds the predetermined percent.

As will be appreciated from the foregoing discussion, the invention provides a new and improved RMS converter system that is substantially more accurate than simple thermal RMS converters. More specifically, the accuracy of the output produced by the invention approaches the accuracy that can be produced utilizing a transfer standards approach to determining the RMS value of an unknown AC signal. The invention has the advantages of producing such a result at a substantially lower cost and much more rapidly than a transfer standards system.

While a preferred embodiment of the invention has been illustrated and described, it will be appreciated the various changes that can be made therein without departing from the spirit and scope of the invention. For example, as discussed above, since the controller 25 receives the same information as that stored in the sample and hold circuit, obviously, the digital signal stored in the controller can be used to control the production of a DC signal that can be used to form the recirculated second input to the thermal RMS converter. This can be done by applying the stored value to a D/A Converter. Further, obviously, the sequence of steps shown in FIG. 3 should be taken as illustrative, rather than limiting since other sequences are within the scope of the invention. That is, various other sequences adapted to achieve the same result fall within the spirit and scope of the invention.

With respect to the sample and hold circuit, while various sample and hold circuits can be utilized, preferably, the sample and hold circuit chosen for use in an actual embodiment of the invention will produce an output having zero offset voltage error. (As will be recognized by those skilled in the electronics art most sample and hold circuits have an offset voltage, which creates an error in their output. One way of alleviating this problem is to subtract the offset voltage error from the resultant output. A more preferred way is to use a sample and hold circuit that has little or no offset voltage error.) A sample and hold circuit that produces an output having substantially zero offset voltage error is described in the U.S. patent application Ser. No. 062,922 entitled "Sample and Hold Circuit," filed Aug. 2, 1979, by Ben Brodie and assigned to the assignee of the present application. Alternatively, a storage circuit other than a sample and hold circuit can be included, if desired. Further, the recirculating converter system of the invention can form part of an overall controller in a test system designed to perform a variety of tests on electronic circuitry including the determining of the RMS value of unknown signals. Hence, the invention can be practiced otherwise than as specifically described herein.

The embodiments of the invention in which an exclusive property or privilege is claimed are defined as follows:

1. A method of accurately determining the RMS value of an unknown signal comprising the steps of:
   (a) applying the unknown signal to an RMS converter having a relatively smooth transfer curve to produce a first converter signal;
   (b) reciculting said first converter signal back to said RMS converter to produce a second converter signal;
   (c) combining said first and second converter signals in accordance with the relationship to $2Y_1 - Y_2$ to obtain a corrected signal, X, that accurately represents the RMS value of the unknown signal, where $Y_1$ is directly related to said first converter signal and $Y_2$ is directly related to said second converter signal;
   (d) combining said first converter signal with said corrected signal in accordance with the relationship $Y_1 - X$ to obtain an error signal;
   (e) again applying the unknown signal to said RMS converter to produce a third converter signal; and,
   (f) subtracting said error signal from said third converter signal to obtain a corrected signal that accurately represents the RMS value of the reapplied unknown signal.

2. A method of accurately determining the RMS value of an unknown signal as claimed in claim 1 wherein said step of again applying the unknown signal to said RMS converter to produce a third converter signal and said step of subtracting said error signal from said third converter signal to obtain a corrected signal that accurately represents the value of the reapplied unknown signal are sequentially repeated.

3. A method of accurately determining the RMS value of an unknown signal as claimed in claim 2 wherein said error signal is stored during the period of time said step of again applying said unknown signal to said RMS converter to produce a third converter signal and said step of subtracting said error signal from said third converter signal to obtain a corrected signal that accurately represents the value of the reapplied unknown signal are sequentially repeated.

4. A method of accurately determining the RMS value of an unknown signal as claimed in claim 3 wherein said converter signals are converted from analog form to digital form prior to being combined, summed and stored.

5. A method of accurately determining the RMS value of an unknown signal as claimed in claim 2 wherein said converter signals are converted from analog form to digital form prior to being combined and summed.

6. A method of accurately determining the RMS value of an unknown signal as claimed in claim 1 wherein said converter signals are converted from analog form to digital form prior to being combined and summed.

7. Apparatus for accurately determining the RMS value of an unknown signal comprising:
   (a) RMS conversion means having a relatively smooth transfer curve for converting an input signal into a DC signal proportional to the RMS value of the input signal;
   (b) recirculating means connected to the output of said conversion means for recirculating the output of said conversion means back to the input of said conversion means;
   (c) controllable switch means connected to said RMS conversion means and said recirculating means for selectively applying either an unknown signal or the output of said recirculating means to the input of said RMS conversion means; and,
   (d) control and combining means connected to said RMS conversion means and said controllable switch means for:
      (i) causing said controllable switch means to apply an unknown signal to said RMS conversion means and receiving the output of said RMS conversion means, said output forming a first converter signal;

(ii) causing said controllable switch means to apply the output of said recirculating means to the input of said RMS conversion means and receiving the output of said RMS conversion means, said output forming a second converter signal;

(iii) combining said first and second converter signals in accordance with the relationship to $2Y_1 - Y_2$ to obtain a corrected signal, X, that accurately represents the RMS value of the unknown signal, where $Y_1$ is directly related to said first converter signal and $Y_2$ is directly related to said second converter signal;

(iv) combining said first converter signal with said corrected signal in accordance with the relationship $Y_1 - X$ to obtain an error signal;

(v) causing said controllable switch means to again apply said unknown signal to the input of said RMS conversion means and receiving the output of said RMS conversion means, said output forming a third converter signal; and, (vi) subtracting said error signal from said third converter signal to obtain a corrected signal that accurately represents the RMS value of the reapplied unknown signal.

8. Apparatus for accurately determining the RMS value of an unknown signal as claimed in claim 7 wherein said control and combining means repetitively reapplies the unknown signal to said RMS converter to produce said third converter signal and subtracts said error signal from said third converter signal to obtain a corrected signal that accurately represents the value of the reapplied unknown signal.

9. Apparatus for accurately determining the RMS value of an unknown signal as claimed in claim 8 wherein said control and combining means includes a memory for storing said error signal during the period of time said control and combining means repetitively reapplies the unknown signal to said RMS converter to produce said third converter signal and subtracts said error signal from said third converter signal to obtain a corrected signal that accurately represents the value of the reapplied unknown signal.

10. An apparatus for accurately determining the RMS value of an unknown signal as claimed in claim 9 wherein said RMS conversion means includes a thermal RMS converter.

11. Apparatus for accurately determining the RMS value of an unknown signal as claimed in claim 10 wherein said RMS conversion means also includes an analog-to-digital conversion means connected to the output of said thermal RMS converter for converting the output of said thermal RMS converter from analog form to digital form prior to said output being applied to said control and combining means.

12. Apparatus for accurately determining the RMS value of an unknown signal as claimed in claim 11 wherein said recirculating means includes a storage means connected to the output of said thermal RMS converter.

13. Apparatus for accurately determining the RMS value of an unknown signal as claimed in claim 12 wherein said storage means is a sample and hold circuit.

14. Apparatus for accurately determining the RMS value of an unknown signal as claimed in claim 13 wherein said controllable switch means includes a first switch connected between an input terminal adapted to receive said unknown signals and the input of said thermal RMS converter and a second switch connected between the output of said sample and hold circuit and the input of said thermal RMS converter.

15. Apparatus for accurately determining the RMS value of an unknown signal as claimed in claim 14 wherein said control and combining means connected to said sample and hold circuit for controlling said sample and hold circuit such that said sample and hold circuit is in its sample mode of operation when said first switch is closed and said second switch is open and is in its hold mode of operation when said first switch is open and said second switch is closed.

* * * * *